(12) United States Patent
Simar, Jr. et al.

(10) Patent No.: US 7,886,255 B2
(45) Date of Patent: Feb. 8, 2011

(54) METHOD FOR DESIGN OF PROGRAMMABLE DATA PROCESSORS

(75) Inventors: Laurence Ray Simar, Jr., Richmond, TX (US); Reid E. Tatge, Missouri City, TX (US)

(73) Assignee: Texas Instruments Incorporated, Dallas, TX (US)

( * ) Notice: Subject to any disclaimer, the term of this patent is extended or adjusted under 35 U.S.C. 154(b) by 488 days.

(21) Appl. No.: 12/017,503

(22) Filed: Jan. 22, 2008

(65) Prior Publication Data

US 2008/0177996 A1    Jul. 24, 2008

Related U.S. Application Data

(60) Provisional application No. 60/885,959, filed on Jan. 22, 2007.

(51) Int. Cl.
*G06F 17/50* (2006.01)

(52) U.S. Cl. .................. 716/104; 716/106; 716/132; 703/16

(58) Field of Classification Search .............. 716/4, 716/17, 18; 703/16
See application file for complete search history.

(56) References Cited

U.S. PATENT DOCUMENTS

| | | | | |
|---|---|---|---|---|
| 6,477,683 | B1* | 11/2002 | Killian et al. ................... | 716/1 |
| 6,523,151 | B2* | 2/2003 | Hekmatpour ................... | 716/4 |
| 6,701,489 | B1* | 3/2004 | Lam .............................. | 716/4 |
| 6,760,888 | B2* | 7/2004 | Killian et al. ................... | 716/1 |
| 7,020,854 | B2* | 3/2006 | Killian et al. ................... | 716/1 |
| 2002/0002698 | A1* | 1/2002 | Hekmatpour ................... | 716/4 |
| 2003/0208723 | A1* | 11/2003 | Killian et al. ................... | 716/1 |
| 2004/0250231 | A1* | 12/2004 | Killian et al. ................... | 716/18 |
| 2006/0259878 | A1* | 11/2006 | Killian et al. ................... | 716/1 |
| 2008/0244471 | A1* | 10/2008 | Killian et al. ................... | 716/1 |
| 2008/0255821 | A1* | 10/2008 | Roesner et al. ............... | 703/15 |
| 2008/0294413 | A1* | 11/2008 | Bobok et al. ................... | 703/16 |

OTHER PUBLICATIONS

Ascia et al., "A GA-Based Design Space Exploration Framework for Parameterized System-On-A-Chip Platforms", IEEE Transactions on Evolutionary Computation, vol. 8, No. 4, Aug. 2004, pp. 329-346.*

Bell et al., "Automatic Testcase Synthesis and Performance Model Validation for High-Performance PowerPC Processors", 2006 IEEE International Symposium on Performance Analysis of Systems and Software, Mar. 19-21, 2006, pp. 154-165.*

(Continued)

*Primary Examiner*—Phallaka Kik
(74) *Attorney, Agent, or Firm*—Robert D. Marshall, Jr.; W. James Brady; Frederick J. Telecky, Jr.

(57) ABSTRACT

A method of integrated circuit programmed data processor design includes selecting a benchmark application, selecting an initial set of architecture parameters, reconfiguring a compiler for the selected architecture parameters, compiling the benchmark, reconfiguring a data processor simulator to the selected architecture parameters, running the complied benchmark on the reconfigured simulator, automatically synthesizing an integrated circuit physical layout and evaluating performance of the selected architecture parameters against predetermined criteria. The method varies the selected architecture parameters upon failure to meet criteria until evaluation of the selected architecture parameters meets the criteria. The method selects a number of datapath clusters to avoid too many input/output ports in data registers.

17 Claims, 2 Drawing Sheets

OTHER PUBLICATIONS

Joseph et al., "A Predictive Performance Model for Superscalar Processors", 39th Annual IEEE/ACM International Symposium on Microarchitecture, Dec. 2006, pp. 161-170.*

Nurmi et al., "A New Generation of Parameterized and Extensible DSP Cores", 1997 IEEE Workshop on Signal Processing Systems, Nov. 3-5, 1997, pp. 320-329.*

Potlapally et al., "Impact of Configurability and Extensibility on IPSec Protocol Execution on Embedded Processors", 19th International Conference on VLSI Design, Jan. 3-7, 2006, pp. 1-6.*

Roma et al., "Parameterizable Hardware Architectures for Automatic Synthesis of Motion Estimation Processors", 2001 IEEE Workshop on Signal Processing Systems, Sep. 26-28, 2001, pp. 428-439.*

* cited by examiner

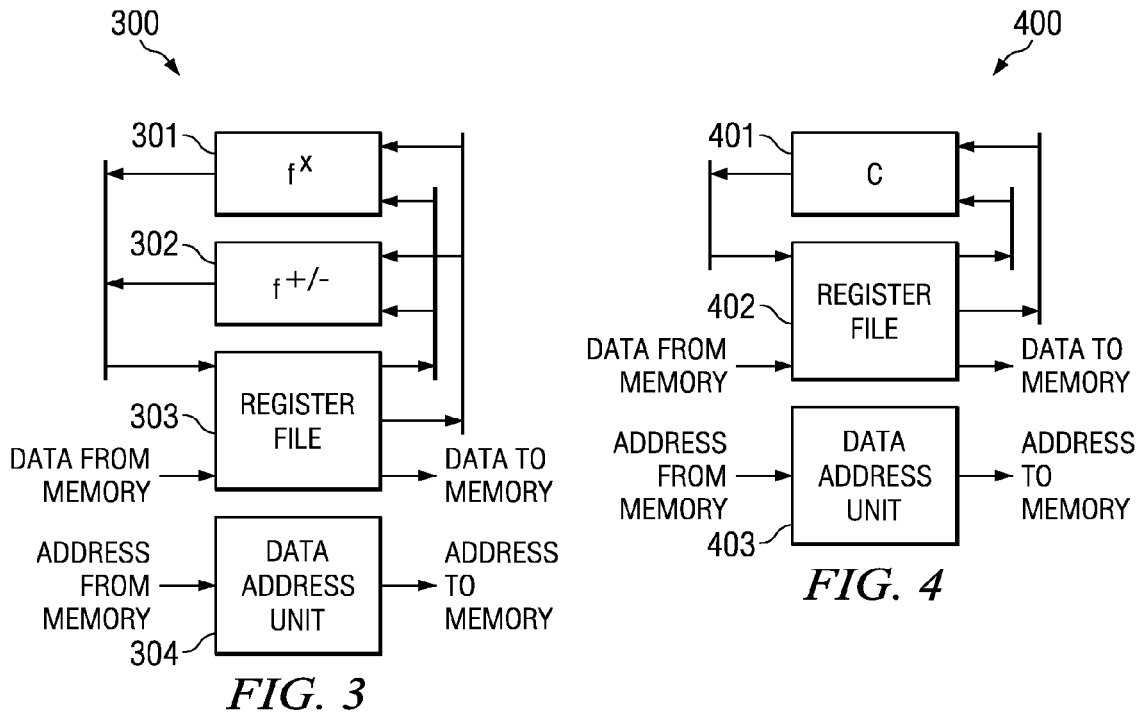
FIG. 3
FIG. 4
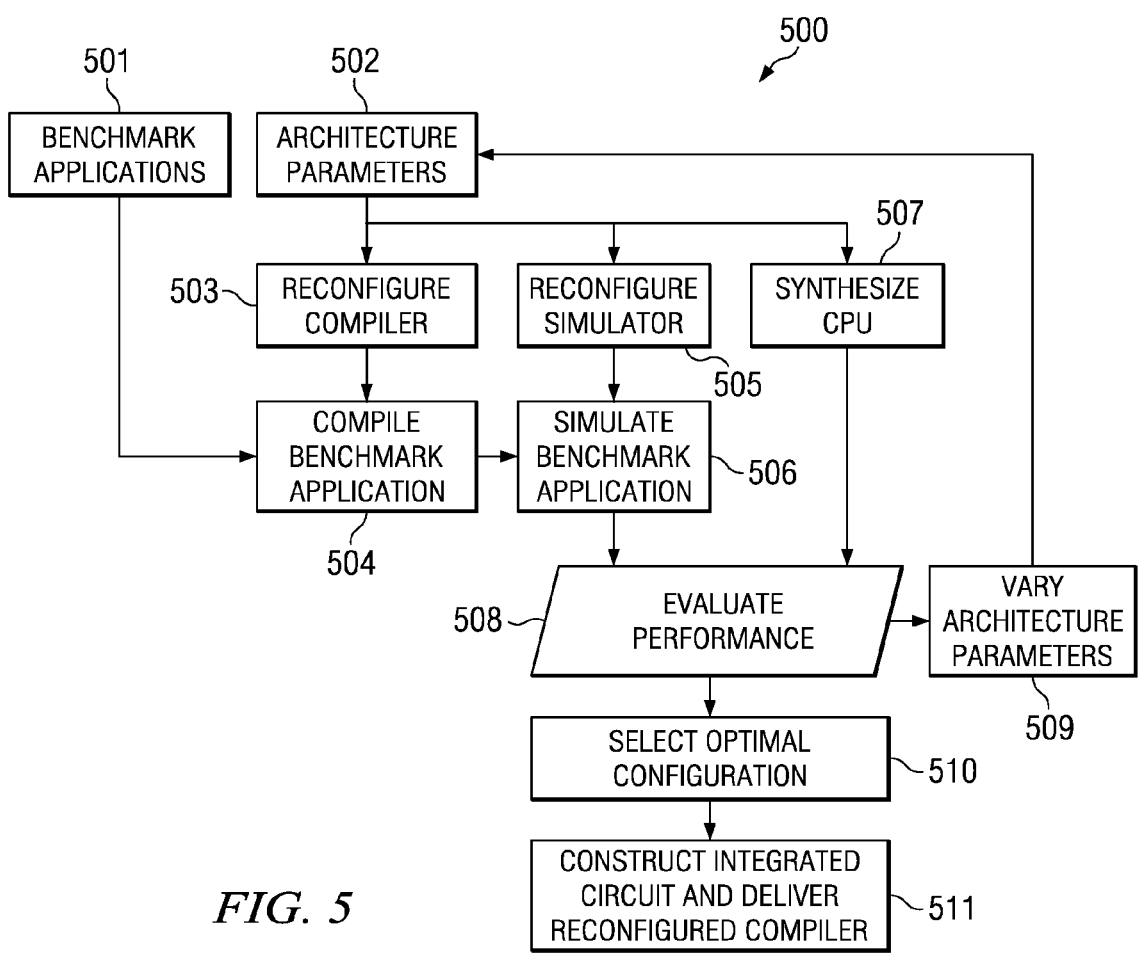
FIG. 5

METHOD FOR DESIGN OF PROGRAMMABLE DATA PROCESSORS

CLAIM OF PRIORITY

This application claims priority under 35 U.S.C. 119(e)(1) to U.S. Provisional Application No. 60/885,959 filed Jan. 22, 2007.

TECHNICAL FIELD OF THE INVENTION

The technical field of this invention is programmable digital data processor design.

BACKGROUND OF THE INVENTION

Increasingly it appears that no digital data processor can fit all applications. There are many dramatically differing requirements for various applications. Each digital data processor manufacturer is beset by a host of competitors with competitive, if not superior, solutions for portions of the application space. Combating this requires an architecture which is scalable, customizable and programmable.

The single most important enabler of DSP architecture development has been shrinking integrated circuit geometries. Smaller geometries permit a single integrated circuit to include more circuits. These additional circuits could include more computational units than integrated circuits of a prior generation.

There are two paths to enable use of greater number of circuits. The first path includes single control stream architectures on a single central processing unit (CPU). Such a single control stream CPU could provide circuits for greater exploitation of computational parallelism. Circuits of this type include very long instruction word (VLIW) architecture where wide issue instructions control simultaneous operation of plural independent functional units. Another variation is single instruction multiple data (SIMD) architectures where plural computational units perform the same operation on corresponding plural data instances. These architectures could take the form of additional datapaths including register files and corresponding functional units. These architectures could employ more complex functional units capable of greater computation complexity. These architectures could provide more functional units per datapath at the expense of increasing the number of data ports in the corresponding register files.

The Texas Instruments TMS320C6000 family of digital signal processors is an 8-way VLIW architecture divided into two symmetrical data paths. Scaling from the original 2 datapaths to 4 or 8 datapaths provides a natural extension of this architecture. Such an extension by data path replication may provide object code compatibility with the original architecture. The original compiler could be extended to search for and take advantage of additional parallelism.

Providing more computational capacity per functional unit could be done in many ways. The Texas Instruments TMS320C6000 family includes such a progression from the original 6000 series to the 6400 series and the 6700 floating point series. Additional computational capacity could be provided by: adding floating-point capability; enabling 32-bit multiplication as an extension from 16-bit multiplication; enabling complex number calculations; and merely making the functional units more similar thus making all functional units more powerful. In the big picture, these are all believed to be mere tweaks.

These approaches are quickly running out of steam. This is primarily determined by the limits of instruction level parallelism (ILP) in a single control stream. There is an open question how quickly they reach their natural limits.

The second path includes multiple control stream architectures. Multiple control stream architectures are of two types. The first type provides multiple program threads on the same central processing unit (CPU). Each thread is by definition independent and thus provides data processing tasks that can be performed independently in parallel hardware. This architecture provides good performance when the latency to access memory or registers is much greater than the compute latency. Such single CPU multi-threading have not been widely used. This technique is more specialized than the other approaches. Good compiler tools to properly match multi-threaded programs to particular applications are lacking.

The second type provides multiple threads on different CPUs. This technique provides an aggressive approach to problems. Since each task and CPU are relatively independent, existing compiler tools can generally be used. Multiple control stream architectures offer the promise of breakthrough performance. They provide an avenue to exploit task level parallelism. The primary question with these techniques is how they can be programmed.

There is a broad spectrum of multiprocessor techniques including: data flow; symmetric multiprocessing; distributed multiprocessing; multi-threaded machines; shared memory; message passing; shared memory with message passing; topologies like systolic, ring, two dimensional mesh and three dimensional mesh; fine grain; and coarse grain. The particular hardware is important but the programming model is critical.

There is a need in the art for solutions to this problem that are both digital signal processing (DSP) centric and capable of exploiting reduced semiconductor feature geometries for significant performance gain. Digital signal processing deals primarily with real-time processing in a manner not likely to be pursued by general purpose processors. There are many applications suitable to multiprocessors including most scientific computing and DSP. There are many multiprocessor architectures and many programming approaches for multiprocessors. The best solution is one that comprehends and is tuned for: the application; the architecture; and the programming.

SUMMARY OF THE INVENTION

This invention makes it possible to create highly optimized programmable processors in a very short time. This invention combines a scalable VLIW architecture template, reconfigurable compiler, reconfigurable simulator and a reconfigurable design flow to rapidly evaluate architecture alternatives.

The architecture of this invention is a scalable and customizable enhanced VLIW DSP platform that enables the creation of targeted DSPs by providing variation in instruction issue width, the number and types of computational elements contained within a cluster and their associated register files and customizability through special purpose computational elements within specialized clusters. Because this invention provides an enhanced VLIW platform, it is an excellent compiler-target, speeding time to market. This invention builds upon existing datapaths and functional units permitting rapids prototyping. This invention uses synthesizable circuit enabling customized clusters for very specialized functions. This invention employs prior art reconfigurable simulator and compiler technology. Based on the experience of others with similar technology, the inventors expect to be able to analyze a few hundred architectural variations across dozens of benchmarks in a single day. Use of existing datapaths would allow the CPU datapath design to be complete in one week. Performance levels achievable using this invention using a 750 MHz clock rate range from 48 to 192 billion instructions per second and from 12 to 48 billion multiplications and addition or subtractions per cycle.

This invention includes: a VLIW template with a scalable instruction word; a scalable compiler comprehending interconnect; a scalable compiler supporting rapid execution; and a database driven design flow.

This invention permits co-design a CPU architecture in parallel with development of target algorithms and generation of the development tools (compilers, assemblers, linkers, etc) for the new processor. A single iteration of a new architecture evaluation can be done in hours rather than months or years.

This invention permits rapid variation of many aspects of the architecture which would otherwise be too difficult to reconfigure quickly. These variations include: pipeline depth (program, data, and execution pipelines); functional unit interconnect; the number of functional units; the number of functional unit clusters; the functional capability of functional units; the mapping of instructions to functional units; the register file sizes; and the VLIW issue width.

BRIEF DESCRIPTION OF THE DRAWINGS

These and other aspects of this invention are illustrated in the drawings, in which:

FIG. 3 illustrates an exemplary floating-point datapath template of this invention;

FIG. 4 illustrates an exemplary customized datapath template of this invention; and FIG. 5 illustrates the design process of this invention.

DETAILED DESCRIPTION OF PREFERRED EMBODIMENTS

Figure 1:
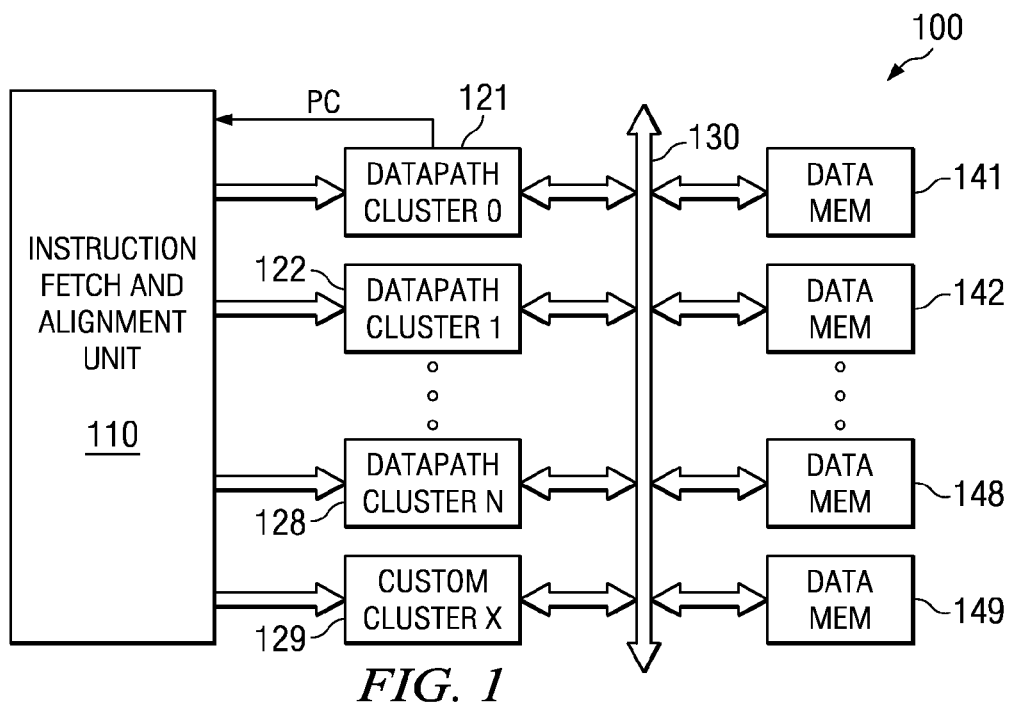
FIG. 1 illustrates an exemplary architecture template of this invention.

This invention depends upon four key technologies which are now viable for the first time. These are: the flexibility of a VLIW architecture template to support scalability and customization; the ability to build a reconfigurable simulator from this VLIW architecture template; the feasibility of a reconfigurable compiler and scheduler to generate code based upon the VLIW architecture template; and the practicality of a synthesizable datapath followed by a hardened datapath.

The architecture template and the set of architecture parameters which can be varied are key. This invention provides the best of these important features in common: scalability; variable numbers of functional units and register files; customizability; enabling addition of functionality that is hard to achieve otherwise; providing good compiler targets; and allowing rapid analysis of targeted applications and benchmarks.

This invention includes the following steps. A reconfigurable compiler and simulator take their specification from the architecture template parameters including different numbers of functional units, register files, and latency. Selection of the architecture template parameters is automated as follows. The process includes: starting with a set of architecture parameters; reconfiguring the compiler and simulator to match the selected architecture parameters; recompiling the application; extracting performance information; and repeating with varying architecture templates until the desired performance is achieved.

This method enables a discontinuity in the way DSPs can be developed. The architecture template parameters are selected to specify desired level of scalability and customization. The simulator is reconfigured based upon these parameters. The compiler and scheduler are reconfigured based upon these parameters. Application benchmarks are run using the simulator and compiler to tune the architecture specification. The CPU is synthesized using these architecture parameters. The method then evaluates the performance, power, and cost. This method iterates as needed.

This method is advantageous because of growing diversity of requirements for end user applications. These diverse requirements include: the performance in DSP millions of instructions per second (MIPS); the power consumption requirements; the data precision required, imaging applications are moving from 8-bits precision to 12-bit and 14-bit, audio applications may now benefit from floating point arithmetic; the required analog integration; the process migration; the changing characteristics of advanced technology nodes in terms of latency, memory types, etc.; the cost goals; and the background infrastructure such as higher GPMs, base stations and voice over internet protocol (VOIP).

This invention includes an enhanced DSP VLIW architecture template with scalable VLIW datapath clusters providing scalability and customizable datapath clusters containing specialized, user defined units. This invention provides programmability via a complete tool chain including an optimizing C compiler, a linear assembler and a high performance simulator and emulator. The invention produces a set of synthesizable datapaths for the CPU. The datapaths provide a CPU performance and area optimized based upon the targeted application. This synthesizable set of datapaths can be followed by hard datapaths and CPUs. This invention supports multiple instruction models for reduced code size, such as VLIW, compact, and SIMD. This invention also supports standardized interfaces.

FIG. 1 illustrates architecture template 100. Architecture template 100 includes instruction fetch and alignment unit 110 servicing multiple exemplary datapath clusters 121, 122, 128 and 129. Each datapath cluster 121, 122, 128 and 129 includes one or more functional units and local register banks. The reason for clusters is to avoid register banks with too many input/output ports. In order to use a functional unit, any required must be in the associated register bank. Such an operand must already be in the associated register bank or must be moved to the associated register bank with an explicit move in a prior instruction. The clusters may be identical making the chip easier to design. Architecture template 100 includes plural exemplary memories 141, 142, 148 and 149. Coupling between datapath clusters 121, 122, 128 and 129 with respective memories 141, 142, 148 and 149 is via a global bus 130. The communication between clusters occurs via global bus 130 and is explicitly scheduled by the compiler.

Another key component of this invention is a tool chain having a compiler at the center. This aggressive instruction level parallelism (ILP) compiler provides the user a uniform view of the platform at the programming language level. This aggressive ILP compiler extracts a level of parallelism often beyond the easy grasp of a human programmer. The compiler can perform very sophisticated loop optimizations such as loop fusion and loop collapsing. The compiler can look across a larger portion of the overall application by techniques such as function in-lining and trace scheduling.

The preferred embodiment of this invention includes three general types of datapath clusters. These datapath clusters are based upon existing datapaths in the TMS320C600s family of DSPs. The first datapath cluster type is known as a 16-bit cluster. This is based upon the TMS320C6200 DSP. This datapath cluster includes two datapaths supporting 16, 32 and 40-bit processing. Typical functional units provided within this datapath cluster type can perform two 16-bit integer multiplications and two 40-bit additions or subtractions per cycle. The second datapath cluster type is known as a floating-point cluster and is based upon the TMS320C6700 DSP. This datapath cluster includes two datapaths supporting those operations noted above in the 16-bit cluster with the addition of floating-point operations. Typical functional units provided in this datapath cluster can perform two 32-bit floating-point multiplications and two 32-bit additions and subtractions per cycle. The third datapath cluster is known as the imaging cluster and is based upon the TMS320C6400 DSP. This datapath cluster includes two datapaths supporting those operations noted above in the 16-bit cluster with the addition of 8-bit SIMD operations for imaging. Each cluster type may have as many as 64 registers in its corresponding register file.

Figure 2:
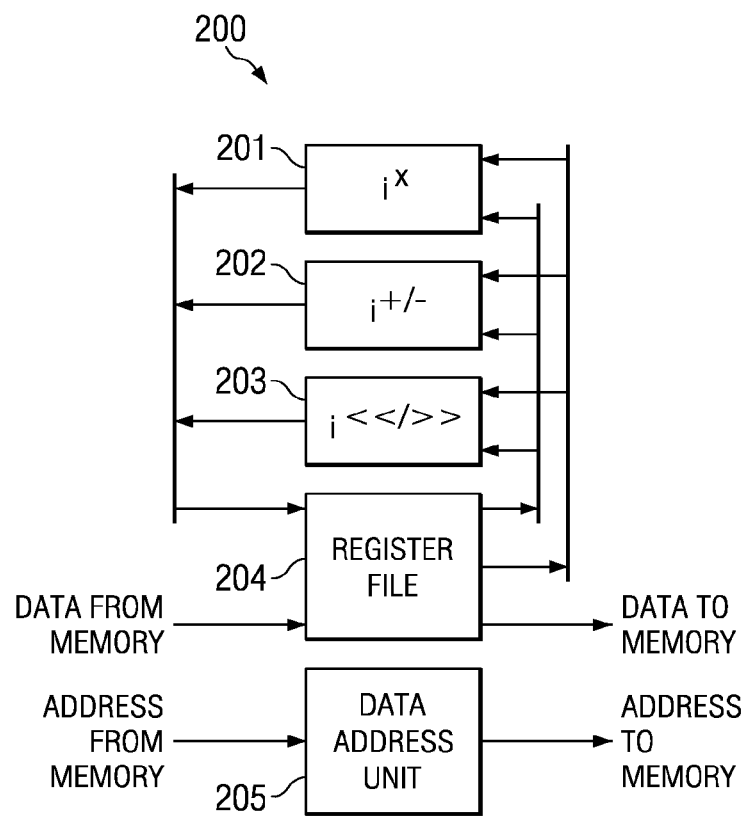
FIG. 2 illustrates an exemplary integer datapath template of this invention.

FIGS. 2 to 4 illustrate three example datapath templates. FIG. 2 illustrates an integer datapath template. FIG. 3 illustrates a floating-point datapath template. FIG. 4 illustrates a customized datapath template. Note that these templates are only examples and the actual selected set of architecture parameters may vary. In particular, any datapath selected in this invention may include more or fewer functional units and may include duplicate, identical functional units.

Integer datapath template 200 includes five components: integer multiplier 201; integer adder/arithmetic logic unit (ALU) 202; shifter 203; register file 204; and data address unit 205. Integer multiplier 201 in response to program instructions calculates the product of two integer operands recalled from register file 204 and stores the resultant product into register file 204.

Integer adder/ALU 202 performs instruction specified arithmetic or logic operations on at least one operand recalled from register file 204 and stores the resultant into register file 204. The range of operations includes: addition and subtraction which may include optional saturation at all 1's or all 0's; two operand bit-wise logical operations including AND, OR, NAND, NOR and exclusive OR (XOR); one operand bit-wise logical operations like NOT; and two operand test operations like less than, less than or equal to, equal to, greater than or equal to and greater than.

Shifter 203 performs shift operations such as: left and right circular shifts; left shifts with zero fill; right shifts with zero extension; and right shifts with sign extension. The shift amount may be stored in a second operand register or an immediate field in the instruction.

Register file 204 includes a plurality of data registers for storing data for supply to operand inputs of integer multiplier 201, integer adder/ALU 202, shifter 203 and further stores the resultants of these functional units. The integer datapath template 200 preferably requires a load/store architecture where operands must be stored within register file 204 for use, i.e. no direct memory access instructions. Register file 204 includes output ports to supply operands from instruction specified data registers to all functional units and input ports to receive resultants from all functional units. Register file 204 includes at least one output port to supply data from an instruction specified data register for storing in an associated addressable memory. Register file 204 also includes at least one input port to receive data from an associated addressable memory and store it in an instruction specified data register. These memory addresses are computed by data address unit 205 for supply as read or write addresses to the associated memory. In the preferred embodiment the number of data registers in register file 204 and their data width are selectable.

Table 1 lists a number of variations in the configurations of integer multiplier 201, integer adder/ALU 202, shifter 203 and register file 204.

TABLE 1

| Functional Unit | Configurations and Input/Output Data Widths | | |
|---|---|---|---|
| | 1 | 2 | 3 |
| Multiplier | 16 × 16 -> 32 | 24 × 24 -> 48 | 32 × 32 -> 64 |
| Adder/ALU | 40 + 32 -> 32 | 56 + 48 -> 56 | 72 + 64 -> 72 |
| Shifter | 16, 32, 40 bit | 24, 48, 56 bit | 32, 64, 72 bit |
| Register File | 16, 32, 40 bit | 24, 48, 56 bit | 32, 64, 72 bit |

Floating-point datapath template 300 includes four components: floating-point multiplier 301; floating-point adder/ALU 302; register file 304; and data address unit 304. Floating-point multiplier 301 calculates the product of two floating-point operands recalled from register file 303 and stores the resultant product into register file 303. Floating-point multiplier 301 is preferably capable of operation on both single-precision (32 bit) and double-precision (64 bit) data words.

Floating-point adder/ALU 302 performs an instruction specified arithmetic or logic operations on at least one operand recalled from register file 304 and stores the resultant into register file 304. The range of operations includes: floating-point addition and subtraction; two operand bit-wise logical operations including AND, OR, NAND, NOR and exclusive OR (XOR); one operand bit-wise logical operations like NOT; and two operand test operations like less than, less than or equal to, equal to, greater than or equal to than and greater than. Floating-point adder/ALU 302 is preferably capable of operation on both single-precision (32 bit) and double-precision (64 bit) data words.

Register file 303 stores data for supply to operand inputs of floating-point multiplier 301 and floating-point adder/ALU 302 and further stores the resultants of these functional units. The floating-point datapath template 300 preferably requires a load/store architecture. Register file 303 includes at least one output port to supply data to store in an associated addressable memory. Register file 303 also includes at least one input port to receive data from an associated addressable memory. These memory addresses are computed by data address unit 304 for supply as read or write addresses to the associated memory.

Customized datapath template 400 includes three components: custom functional unit 401; register file 402; and data address unit 403. Custom functional unit 401 preferably performs a custom operation on at least one operand recalled from register file 402 and returns the resultant to register file 402. Examples such customized functions include encryption, Galois field arithmetic and bit interleaving. These can be built around the basic register file and load/store capability of a cluster. Their specialized functional units would probably be synthesized. The compiler could support these custom functions with a function call or pragma.

Register file 402 stores data for supply to operand inputs of custom function unit 401 and further stores the resultants of custom functional unit 401. The customized template 400 preferably requires a load/store architecture. Register file 402 includes at least one output port to supply data to store in an associated addressable memory. Register file 402 also includes at least one input port to receive data from an associated addressable memory. These memory addresses are computed by data address unit 403 for supply as read or write addresses to the associated memory.

FIG. 5 illustrates design process 500 of this invention. An initial input to design process 500 is a benchmark application 501. Benchmark application 501 represents at least a portion of the desired application which the final integrated circuit data processor is expected to perform. For example, this may represent an audio decoding process when the target consumer product is a compressed music player. For a hard disk drive video recorder, this may represent the encoding and compression of a high definition (HD) television signal in real time. This benchmark application typically would be represented in a high-level computer language, such as C. Alternatively, it could be represented in a generic assembly language program.

A second initial input to design process 500 is architecture parameters 502. Typically a skilled designer would select a set of architecture parameters such as the number of datapath clusters, the mixture of functional units within the clusters and the attributes of the corresponding register files believed to be able to satisfy the benchmark. In accordance with this invention any such architecture parameters should be scalable and customizable. Scalability is the ability to vary the number of existing resources to vary the computational power of the design. Customizability is the ability to add resources of a different type to the design. In this invention, scalability permits variance in the instruction width and the number and types of computational clusters. Scaling in this sense does not change the set of operations in the instruction set architecture (ISA) since this is based upon the existing types of computational clusters. In this invention, customizability permits addition of functional units having different, special purpose functionality, such as encryption, Galois field arithmetic and bit interleaving.

The advantages of scaling and customizing are very dependent upon the benchmark algorithms and programs representative of an application. Sometimes, a large factor speedup can be obtained with very specialized sub-word parallelism. Sometimes doubling the number of functional units doubles performance, sometimes it adds no performance at all. Sometimes customization can have dramatic effect on inner loops, but little effect on the whole application. The best mix of scalability and customization is determined by the benchmark application.

Step 503 reconfigures the data processor compiler and scheduler based upon the parameters selected in step 502. In this invention, reconfiguration of the compiler and other program design tools is greatly aided by scalability and selection of datapath clusters and functional units similar to those of an existing compiler. Thus the reconfigurable compiler is originally written for the range of architecture parameters available in step 502.

Step 504 compiles the benchmark application using the reconfigured compiler. This process generates instruction code directed to the architecture parameters selected in step 502.

Step 505 reconfigures a data processor simulator for the architecture parameters selected in step 502. This simulator provides a test benchmark for operation of a digital data processor constructed according to the architecture parameters selected in step 502. The simulator is a computer program that operates upon compiled instruction code directed to the target hardware and produces data indicative of the computational operation of the simulated hardware. The reconfigurable simulator is originally written for the range of architecture parameters available in step 502.

Step 506 applies the compiled benchmark application of step 504 to the simulator of step 505. This simulates the operation of a digital data processor constructed according to the architecture parameters selected in step 502. This simulation provides data concerning the nature of the operation relative to the benchmark.

Step 507 provides a synthesized integrated circuit design (CPU) of the architecture parameters selected in step 502. Proper specification of the building blocks of the architecture parameters permits production of an automated integrated circuit layout design. This automated integrated circuit layout design enables automated production of the masks needed to construct the integrated circuit. Such a synthesizable design is in contrast to a so-called "hard" design where the layout of circuits including transistors and connections is made by a skilled artisan. Such "hard" designs often achieve better circuit density, reducing manufacturing costs, at the expense of much careful labor. A synthesizable design is most applicable for integrated circuits of limited production where the design costs predominate over manufacturing costs.

Step 508 evaluates the performance of the architecture parameters selected in step 502 relative to the benchmark specified in step 501. The simulation of step 506 permits determination if the selected architecture parameters would achieve the desired performance on the selected benchmark. In particular the simulator performance would indicate the number of cycles necessary to perform the function. This number of cycles together with a target clock rate would indicate if the architecture parameters meet a timing goal of the design. The synthesized CPU enables determination of the manufacturing costs from the integrated circuit area needed to embody the design. The synthesized CPU also enables determination of electric power consumed by the manufactured device. Each of these factors may be important for determination of whether the selected architecture parameters of step 502 meet a design goal.

If the currently specified architecture parameters fail to meet the design goal, then step 509 varies the architecture parameters. Selection of new architecture parameters may be an automatic directed search within a designed specified architecture space. Alternatively, a skilled designer may be able to study the evaluation and make an expert determination of the change in specified architecture parameters. For example, it may be easy to determine that an additional multiplier functional unit will enable the new design to meet the goal. This could be done by seeking scheduling bottlenecks in the simulation. It may also be possible to determine that a custom functional unit to perform a critical function may meet the design goal.

In any case, a new set of architecture parameters is selected in step 502. This new set of architecture parameters is subjected to the process 500 just described to evaluate performance, cost and power against a design goal. Process 500 iterates as needed until selection of an optimal configuration in step 510.

In step 511 an integrated circuit is constructed in accordance with the synthesized layout of step 507 of the architecture parameters meeting the criteria of the design goal. This integrated circuit is coupled to the compiler reconfigured for this set of architecture parameters of step 503. This compiler permits the user of the integrated circuit to produce programmed applications on this hardware. At some volume level of integrated circuits to be supplied, it is economical to replace the synthesized layout for at least some parts of the integrated circuit with a custom layout optimized by a skilled artisan. Such "hard" layouts often provide smaller size, thereby reducing manufacturing cost.

Several benefits to integrated circuit design come from using the style of architecture illustrated in FIGS. 1 to 4. This architectural style provides scalability. Each cluster can be built and replicated to fit the size of the final DSP. The datapath cluster types are based on designed cluster in the TMS320C6000 family of DSPs. New clusters can be created using a custom/synthesis approach which will fit into the prior architecture. The partitioned scheme improves testability and maintainability. It is further possible to consider implement redundancy and replacing a faulty datapath cluster.

Current estimates indicate that clusters could be replicated and placed and routed in one week using existing datapaths. The inventors expect to be able to create optimized DSPs within about 20 staff months. Table 2 lists some of the parameters of this architecture family.

TABLE 2

| Parameter | Description |
|---|---|
| Types of Clusters | 16-bit |
| | Floating-point |
| | Image |
| | Customized |
| Numbers of functional units | from 1 to 64 |
| Register sizes | 8 to 64 per cluster |
| Memory system | Variable number of banks and bank size |
| Memory latency | At least two cycles. |

These parameters should not be considered exemplary only and not hard requirements.

The original goals of the TMS320C6200 family were high performance on DSP algorithms while improving the programmability over other DSPs. The TMS320C6200 delivered the first combination of a VLIW DSP and software-pipelining compiler. This design used many fast functional units in parallel, and extended some of the basic Reduced Instruction Set Computer (RISC) tenets: the architecture is load/store; the implementation is exposed to the compiler; there is no microcode, and there is almost no hardware devoted to synchronization, arbitration or interlocking. The compiler has the primary responsibility for runtime resource usage. This development provides an important lesson. To be successful, a DSP must involve the architecture and the compiler. This stands in stark contrast to many other DSPs where the process has submitted the architecture over to the compiler team and hoping for the best or complaining about the results.

As shrinking semiconductor geometries enable integration of more computational units within a CPU, the ability to extract parallelism will increasingly be satisfied by the compiler. The compiler must be able to expose large amounts of parallelism by a variety of loop optimizations and cross-procedural analysis. Thus there is a bond between the architecture implementation and compiler. All aspects of the implementation should be visible to the compiler but developed to be exploited by the compiler. In this way, a very cost effective high-performance architecture can be developed. This architecture can then be exploited to its fullest by the compiler.

Table 3 lists estimates of performance requirements for several broadband application.

TABLE 3

| Application | Baseband Bandwidth (MHZ) | GMACS | Fclk (MHz) | Number of MACs per cycle Resulting number of CPUs | | |
|---|---|---|---|---|---|---|
| | | | | 4 | 16 | 64 |
| WLAN 802.11a/b/g | 20 | 20 | 800 | 2 | | |
| WLAN 802.11a/b/g with 2:1 channel Bonding | 40 | 40 | 800 | | 1 | |
| WLAN 802.11a/b/g with 2x2 MIMO | 20 | 40 | 800 | | 1 | |
| 4G OFCDM (NTT Docomo) | 100 | 200 | 800 | | 4 | |
| 4G OFCDM with 2x2 MIMO | 100 | 200 | 800 | | 4 | |
| ADSL CO (16 channels) | 16 | 16 | 800 | 2 | | |
| ADSL CPE | 1 | 1 | 250 | 1 | | |
| VDSL CO (8 channels) | 96 | 96 | 800 | | 2 | |
| VDSL CPE | 12 | 12 | 800 | 1 | | |
| Cable Modem | 6 | 6 | 400 | 1 | | |

In this analysis Multiply Accumulates (MACs) are used as a rough measure of performance.

Table 3 shows that scaling this invention to 16 clusters (assuming a single datapath per cluster) can cover four of the application spaces. Scaling this invention to 64 clusters will cover five application spaces. The resulting performance levels at 750 MHz are listed in Table 4.

TABLE 4

| Number of Clusters | Instructions Per Second | Multiply Accumulates Per Second |
|---|---|---|
| 16 | 48 Billion | 12 Billion |
| 64 | 192 Billion | 48 Billion |

Designs should be optimized across critical parameters: applications drive architecture analysis; architecture supports performance scaling; scalability and customizability; incorporating effects of process such as analog and interconnect; automatic tool-set generation including compiler, assembler, simulator, emulation; and field programmable gate array (FPGA) prototyping. This all must be done quickly to enable: rapid time to architecture selection and implementation; rapid time to process migration. In this invention new implementations could be complete in as little as three months.

Four key technologies are viable for the first time. These are: DSP VLIW architecture template; reconfigurable simulator; reconfigurable compiler and scheduler; and synthesizable datapaths. These technologies work together to provide significant advantages such as: optimized architectures driven by applications and incorporating process capabilities; automatic tool-suite generation; and rapid time to market.

What is claimed is:

1. A method of design of an integrated circuit programmed data processor comprising the steps of:
   selecting a benchmark application for the data processor;
   selecting an initial set of architecture parameters for the data processor including a plurality of datapath clusters, each datapath cluster consisting of a data register file including plurality of associated data registers, at least one functional unit capable of data processing operations upon data stored in said data registers in response to program instructions, and at least one data address unit operable to calculate data addresses in a memory in response to program instructions, wherein a functional unit may access only data stored in a data register within a same data cluster, and said plurality of datapath clusters having a number selected to avoid too many input/output ports in said data register files;

reconfiguring a reconfigurable compiler to generate program code adapted to run on said selected set of architecture parameters;

compiling said benchmark application with said reconfigured compiler;

reconfiguring a reconfigurable data processor simulator to simulate said selected set of architecture parameters;

running said complied benchmark application on said reconfigured simulator;

automatically synthesizing an integrated circuit physical layout of said selected architecture parameters;

evaluating performance of said selected set of architecture parameters against a predetermined set of criteria from said running of said complied benchmark application on said reconfigured simulator and said synthesized integrated circuit physical layout; and if evaluation of said selected set of architecture parameters fails to meet said predetermined set of criteria, varying said selected architecture parameters and repeating said steps of reconfiguring said compiler, compiling said benchmark application, reconfiguring said simulator, running said complied benchmark application, automatically synthesizing an integrated circuit physical layout and evaluating performance, until evaluation of said selected set of architecture parameters meets said predetermined set of criteria.

2. The method of claim 1, wherein:
said at least one functional unit includes an integer multiplier functional unit operable in response to program instructions to calculate a product of two integer operands recalled from said register file and store a resultant product into said register file.

3. The method of claim 1, wherein:
said at least one functional unit includes an integer adder/ALU operable in response to program instructions to perform an arithmetic or logic operations on at least one operand recalled from said register file and store a resultant into register file.

4. The method of claim 3, wherein:
said arithmetic or logic operation includes addition and subtraction.

5. The method of claim 3, wherein:
said arithmetic or logic operation includes addition and subtraction with saturation.

6. The method of claim 3, wherein:
said arithmetic or logic operation includes bit-wise logical operations.

7. The method of claim 3, wherein:
said arithmetic or logic operation includes two operand compare operations.

8. The method of claim 1, wherein:
said at least one functional unit includes an integer shifter operable in response to program instructions to perform shift operations of an instruction specified shift amount on an operand recalled from said register file and store a resultant into said register file.

9. The method of claim 1, wherein:
said at least one functional unit includes a floating-point multiplier operable in response to program instructions to multiply floating-point operands recalled from said register file and store a product into said register file.

10. The method of claim 1, wherein:
said at least one functional unit includes a floating-point adder operable in response to program instructions to add or subtract floating-point operands recalled from said register file and store a product into said register file.

11. The method of claim 1, wherein:
said step of evaluating performance of said selected set of architecture parameters against a predetermined set of criteria includes determining whether a number of cycles to perform said benchmark application in said reconfigured simulator is less than a number needed to meet a timing goal.

12. The method of claim 1, wherein:
said step of evaluating performance of said selected set of architecture parameters against a predetermined set of criteria includes determining whether said synthesized integrated circuit physical layout is less than a predetermined size needed to meet a manufacturing cost goal.

13. The method of claim 1, wherein:
said step of evaluating performance of said selected set of architecture parameters against a predetermined set of criteria includes determining whether said synthesized integrated circuit physical layout would consume less than a predetermined amount of electric power.

14. The method of claim 1, wherein:
said step of selecting an initial set of architecture parameters selects a set of architecture parameters within a designer specified architecture space; and
said step of varying said selected architecture parameters includes an automated search of architecture parameters within said designer specified architecture space.

15. The method of claim 1, wherein:
said step of varying said selected architecture parameters includes searching said simulation for bottlenecks and specifying architecture parameters to eliminate said bottlenecks.

16. The method of claim 1, further comprising:
constructing an integrated circuit corresponding to a set of architecture parameters meeting said predetermined set of criteria.

17. The method of claim 16, further comprising:
substituting a designer specified integrated circuit layout for said automatically synthesized integrated circuit physical layout of selected portions of said selected architecture parameters.

\* \* \* \* \*